(12) United States Patent
Letavic

(10) Patent No.: US 7,737,524 B2
(45) Date of Patent: Jun. 15, 2010

(54) LATERAL THIN-FILM SOI DEVICE HAVING A FIELD PLATE WITH ISOLATED METALLIC REGIONS

(75) Inventor: Theodore James Letavic, Putnam Valley, NY (US)

(73) Assignee: NXP B.V., Eindhoven (NL)

( * ) Notice: Subject to any disclaimer, the term of this patent is extended or adjusted under 35 U.S.C. 154(b) by 271 days.

(21) Appl. No.: 10/574,065

(22) PCT Filed: Sep. 27, 2004

(86) PCT No.: PCT/IB2004/051875

§ 371 (c)(1),
(2), (4) Date: Mar. 30, 2006

(87) PCT Pub. No.: WO2005/031876

PCT Pub. Date: Apr. 7, 2005

(65) Prior Publication Data

US 2007/0114608 A1    May 24, 2007

Related U.S. Application Data

(60) Provisional application No. 60/507,190, filed on Sep. 30, 2003.

(51) Int. Cl.
*H01L 23/58* (2006.01)
*H01L 27/01* (2006.01)
*H01L 27/12* (2006.01)

(52) U.S. Cl. ................. 257/488; 257/339; 257/347; 257/409; 257/E29.009

(58) Field of Classification Search .................. 257/347, 257/409, 339, 488, E29.009, E29.011
See application file for complete search history.

(56) References Cited

U.S. PATENT DOCUMENTS

| 4,614,959 | A | | 9/1986 | Nakagawa |
| 5,060,047 | A | | 10/1991 | Jaume |
| 5,204,545 | A | | 4/1993 | Terashima |
| 5,374,843 | A | * | 12/1994 | Williams et al. ............. 257/492 |
| 5,412,241 | A | | 5/1995 | Merchant |
| 5,640,040 | A | | 6/1997 | Yamaguchi et al. |
| 6,127,703 | A | * | 10/2000 | Letavic et al. ................ 257/347 |
| 6,246,101 | B1 | | 6/2001 | Akiyama |
| 2002/0043699 | A1 | | 4/2002 | Aliyama |

OTHER PUBLICATIONS

Sze, Semiconductor Devices, Physics and Technology, $2^{nd}$ Edition, John Willey & Son, INC., 2001, pp. 89, 90, and 94.*
"Over 1000V n-ch LDMOSFET and p-ch LIGBT with JI RESURF Strucuture and Multiple Floating Field Plate" by T. Terashima, Symposium on Power Semiconductor Devices & ICs.

* cited by examiner

*Primary Examiner*—Shouxiang Hu

(57) ABSTRACT

In a lateral thin-film Silicon-On-Insulator (SOI) device, a field plate is provided to extend substantially over a lateral drift region to protect the device from package and surface charge effects. In particular, the field plate comprises a layer of plural metallic regions which are isolated laterally from one another by spacing so as to assume a lateral electric field profile which is established by a volume doping gradient in the silicon drift region.

14 Claims, 1 Drawing Sheet

LATERAL THIN-FILM SOI DEVICE HAVING A FIELD PLATE WITH ISOLATED METALLIC REGIONS

CROSS REFERENCE TO RELATED APPLICATION

Figure 1:
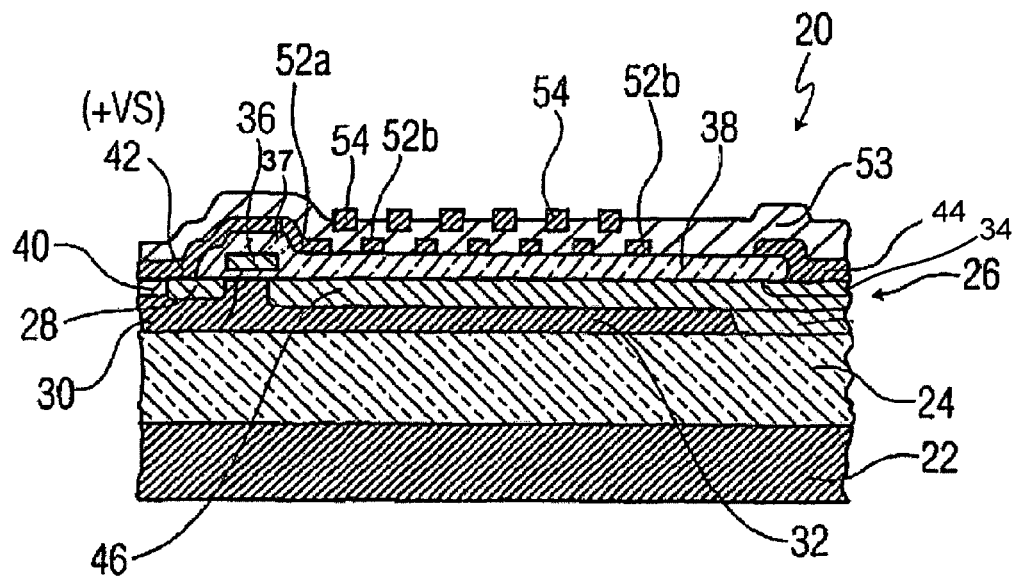

This application claims the benefit of U.S. provisional application Ser. No. 60/507,190 filed Sep. 30, 2003, which is incorporated herein in whole by reference.

The present invention relates to thin-film Semiconductor-On-Insulator (SOI) devices, and more particularly to a field plate with laterally isolated metallic regions used in such devices, which forms a linear lateral electric field to eliminate an electric field enhancement.

A field plate is used in a Semiconductor-On-Insulator (SOI) device to shield the drift region of the device from package and surface charge effects, which may be caused by moisture or other charged containments on the surface of the wafer. The field plate is usually of metallic material, and is connected to, or an extension of, the source region or the gate electrode, such as in U.S. Pat. Nos. 6,127,703 and 5,412,241, commonly-assigned with the instant application and incorporated herein by reference.

However, such a field plate may bring an electric field enhancement at the edge of the field plate, which results in electron injection into the interlevel dielectric. This problem is more profound in a high voltage SOI PMOS device where the drift region has a linearly-graded charge profile. The device may break down well before the specified voltage due to the high electric field at the end of the field plate. In practice, the device exhibits charge injection into the dielectric layer in the region of high electric field to reduce the imposed field.

U.S. Pat. No. 6,246,101 issued to Akiyama describes an isolation field plate chain structure for a high voltage device in which voltage is supported vertically in the device by depletion of the pn junction of plate chain formed by the field plate chain. Thus, the lateral electric field is specified by design of the capacitive field plate chain, which is thus complicated in component design. The doping in the drift region does not determine the lateral electric field.

Thus, there is a need for a field plate with simple structure and design, in which the electric field enhancement is eliminated.

To realize the above goal, the present invention provides a lateral thin-film Silicon-On-Insulator (SOI) device which comprises a semiconductor substrate, a buried insulating layer on the substrate, and a lateral MOS transistor device in an SOI layer on the buried insulating layer and having a source region of a first type of conductivity formed in a body region of a second type conductivity, a lateral drift region of a second type conductivity adjacent the body region, a drain region of a first conductivity and laterally spaced apart from the body region by the lateral drift region, a gate electrode insulated from the body region and drift region by an insulation region, and a field plate extending substantially over the lateral drift region. In particular, according to the present invention, the field plate comprises a layer of plural metallic regions which are isolated laterally from one another by spacing so as to form a linear lateral electric field distribution. Preferably the field plate is an extension of the source region. Thus, the voltage in the isolated regions is linearly distributed laterally, and drops lineally to a lower value at the end of the field plate. This prevents a sudden large voltage change across the geometry of the device, and the large electric field that would otherwise result.

Preferably, the transistor is a PMOS transistor in which the lateral drift region has a linearly-graded charge profile, and the voltage drop in the field plate follows the electric field in the drift region.

Preferably, the device comprises another metallic region located above the spacing in the first layer, and isolated from the first layer as well.

The isolated metallic regions are preferably embedded in a dielectric layer of high resistivity.

Figure 2:
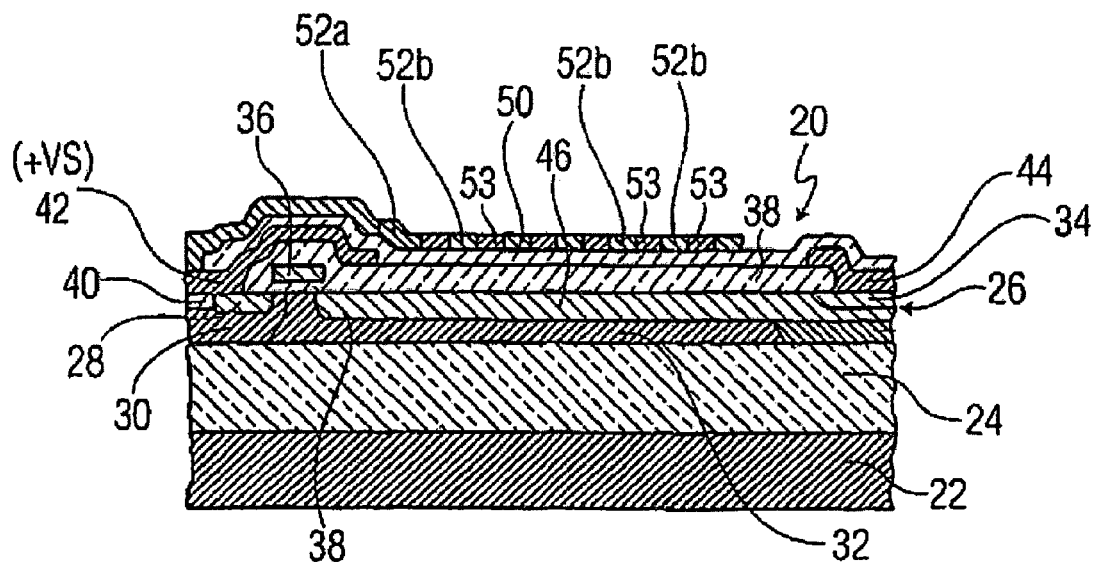

Further features and advantages of the present invention will become clearer after reading the detailed description of the preferred embodiment according to the present invention with a reference to the accompanying drawings, in which:

FIG. 1 shows a simplified cross-sectional view of a first embodiment of a lateral thin-film SOI device according to the present invention; and FIG. 2 is similar to FIG. 1, but shows a second embodiment of a lateral thin-film SOI device according to the present invention.

As shown in FIG. 1, a lateral thin-film device, here an SOI PMOS transistor 20, comprises a semiconductor substrate 22, a buried insulating layer 24, and a semiconductor surface SOI layer 26 in which the device is fabricated. The PMOS transistor includes a source region 28 of p-type conductivity, a body region 30 of n-type conductivity, a lateral drift region 32 of n-type conductivity, and a drain region 34 of p-type conductivity. The device also includes a gate electrode 36 which is completely insulated from the underlying semiconductor surface layer 26 and other conductive portions of the device by an oxide insulation region 38. Additionally, the transistor 20 further includes a body contact surface region 40, a surface-joining p-type conductivity drain extension region 46, a source contact electrode 42 which is tied to a high voltage +Vs, and a drain contact electrode 44.

A field plate is provided to extend laterally and substantially covers the lateral drift region 32. According to the present invention, the field plate comprises a segment or region 52a that is connected to, or an extension of, the source region 42.

The field plate also comprises a plural of isolated metallic segments or regions 52b, which are laterally isolated from one another, as well as from the region 52a, by spacing. Thus, only region 52a is tied to the high voltage +Vs of the source region 32. The field plate, which comprises the regions 52a and 52b, is embedded in a dielectric layer 53. The dielectric layer 53 is preferably a layer of high resistive silicon-rich silicon nitride.

Because of the isolation, unlike in the prior art where the voltage throughout the whole field plate is the same as the high voltage +Vs of the source region, the voltage in the field plate of the present invention is linearly distributed laterally. In other words, it drops linearly from the same high voltage +Vs of the source region 42 at its most left region (i.e., the region 52a) to a much lower value at the end of the field plate 52, i.e., at its most right region. Therefore, the electric field enhancement that existed in the prior art at the end of the field plate is eliminated.

Preferably, as shown in FIG. 1, there is another layer of metallic regions 54 which are also embedded in the dielectric layer 53. Like metallic regions 52a, 52b, metallic regions 54 are laterally isolated from one another and from the metallic regions 52a, 52b as well, by means of the dielectric layer 53. The metallic regions 54 are located exactly above the isolation spacing or openings formed in the metallic regions 52a, 52b, so as to shield the spacing or openings in the metallic regions 52a, 52b from the package charge effects.

The lateral drift region 32 is preferably provided with a linearly-graded charge profile over at least a major portion of its lateral extent such that the doping level in the lateral drift region 32 increases in a direction from the drain region 34 toward the source region 28. In such a situation, the field plate preferably has a lateral electric field distribution or profile that exactly follows the electric field in the SOI drift region 32.

FIG. 2 shows another embodiment of the SOI device according to the present invention. Since the structure of this embodiment is similar to that in FIG. 1, and like elements are referenced by like numerals for easy identification, only the differences are described here. In the embodiment shown in FIG. 2, unlike in FIG. 1 where the field plate comprises two layers of metallic regions 52a, 52b and 54, the field plate only comprises a layer of metallic regions. In particular, the filed plate in FIG. 2 comprises a region 52a that is connected to, or an extension of, the source region 42, as well as isolated regions 52b. Because the isolation spacing in the metallic regions is not covered, thus the protection of package charge is less effective than that of the embodiment in FIG. 1. It may be noted in this embodiment the isolating dielectric layer 53 does not cover the isolated metallic regions 52, and the metallic regions 52 are provided on another dielectric layer 50 between the field plate and the SOI layer 26.

The individual metallic regions can be patterned into any shape, and preferably have a size about 2× the smallest feature for the process. Alternatively, the relative width and spacing of the metallic regions can be defined so as to obtain a desired electric field profile.

Though the above has described in detail the preferred embodiments according to the present invention, it shall be appreciated that numerous changes, modifications and adaptations are possible to the those skilled in the art without departing the spirit of the present invention. For example, the SOI device may be a NMOS device instead of PMOS device, and the field plate 32 may be an extension, or connected to, the gate electrode 36 (as shown by dashed lines 37 in FIG. 1) instead of the source region 42, Thus, the scope of the invention is intent to be solely defined in the accompanying claims

The invention claimed is:

1. A lateral thin-film Silicon-On-Insulator (SOI) device comprising
   a semiconductor substrate,
   a buried insulating layer on said substrate, and
   a lateral MOS transistor device in an SOI layer on said buried insulating layer and having
      a source region of a first type conductivity formed in a body region of a second type conductivity,
      a lateral drift region of a second type conductivity adjacent said body region,
      a drain region of said first type conductivity and laterally spaced apart from said body region,
      a gate electrode insulated from said body region and drift region by an insulation region,
      an insulation layer on and laterally adjacent to the gate electrode, and
      a field plate on the insulation layer and separated from the gate electrode and the drain extension region by the insulation layer, the field plate being connected either to said source region or said gate electrode and extending substantially over said lateral drift region, wherein said field plate comprises a first layer of plural metallic regions which are isolated laterally and spaced apart from one another, and wherein the lateral drift region includes dopants arranged with a lateral doping gradient.

2. The device of claim 1 wherein said isolated metallic regions are located in a layer that is vertically above a layer including the gate electrode, and are isolated from one another by a dielectric layer.

3. The device of claim 2 wherein said field plate further comprises another layer of plural metallic regions located above said dielectric layer in spaces between the metallic regions, laterally isolated from one another, and isolated from said metallic regions of said first layer by said dielectric layer.

4. The device of claim 3 wherein said dielectric layer is a silicon-rich nitride layer.

5. The device of claim 4 further comprises another dielectric layer provided between said field plate and said MOS transistor device.

6. The device of claim 3 wherein said first type conductivity is p-type conductivity, and said second type conductivity is n-type conductivity.

7. The device of claim 1 wherein said lateral drift region is provided with a linearly-graded charge profile.

8. The device of claim 7 wherein said first type conductivity is p-type conductivity, and said second type conductivity is n-type conductivity.

9. The device of claim 1 wherein said first type conductivity is n-type conductivity, and said second type conductivity is p-type conductivity.

10. The device of claim 1 wherein a first one of said metallic regions in the field plate is connected to said source region and the remaining ones of said metallic regions are capacitively coupled to the first one of said metallic regions to linearly distribute a voltage at the source region across the field plate.

11. The device of claim 1 wherein a first one of said metallic regions in the field plate is connected to said gate electrode and the remaining ones of said metallic regions are capacitively coupled to the first one of said metallic regions to linearly distribute a voltage at the gate electrode across the field plate.

12. The device of claim 1, further including
   a source contact region electrically coupled to the source region, having an extension above the gate on the insulation layer, and being separated both laterally and vertically from the gate electrode by the insulation layer, and
   a drain contact region electrically coupled to the drain region, having an extension on the insulation layer, and being separated laterally from the gate electrode by the insulation layer,
   the field plate extending between the extensions of the source contact region and the drain contact region on the insulation layer.

13. A lateral thin-film Silicon-On-Insulator (SOI) device comprising
   a semiconductor substrate;
   a buried insulating layer on the substrate; and
   a lateral MOS transistor device in an SOI layer on said buried insulating layer and having
      a source region of a first conductivity type formed in a body region of a second conductivity type,
      a lateral drift region of the second conductivity type adjacent the body region,
      a drain region of the first conductivity type and laterally spaced apart from the body region by the lateral drift region,
      a gate electrode insulated from said body region and drift region by an insulation region,
      an insulation layer on and laterally adjacent to the gate electrode, source and drain contact regions in a layer region including the gate electrode and respectively electrically contacting the source and drain regions, the contact regions being laterally separated from the gate electrode by the insulation layer and a field plate arrangement, on the insulation layer, having a plurality of conductive regions that laterally extend substantially over the lateral drift region and that are insulated and spaced apart from one another by an insulative material, a first one of the conductive regions at a first end of the field plate being connected either to the source region or the gate electrode, the conductive regions linearly distributing a voltage at the first conductive region across the other conductive regions to an opposite end of the field plate, the distributed voltage dropping laterally across the field plate from the first end to the opposite end, wherein the lateral drift region includes dopants arranged with a lateral doping gradient.

14. The device of claim 13, wherein a linearly-graded charge profile is provided to the lateral drift region, the charge profile dropping linearly from a high charge profile below the first end of the field plate arrangement to a low charge profile below the opposite end of the field plate arrangement.

* * * * *